(12) United States Patent
Endo et al.

(10) Patent No.: US 7,713,685 B2
(45) Date of Patent: May 11, 2010

(54) EXPOSURE SYSTEM AND PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 1065 days.

(21) Appl. No.: 11/143,666

(22) Filed: Jun. 3, 2005

(65) Prior Publication Data

US 2005/0277069 A1 Dec. 15, 2005

(30) Foreign Application Priority Data

Jun. 9, 2004 (JP) ............... 2004-171592

(51) Int. Cl.
*G03F 7/26* (2006.01)
(52) U.S. Cl. ..................... 430/327; 430/311
(58) Field of Classification Search ............. 430/311, 430/327
See application file for complete search history.

(56) References Cited

U.S. PATENT DOCUMENTS

| | | | |
|---|---|---|---|
| 5,792,596 A | 8/1998 | Yasuzato et al. | |
| 6,051,101 A | 4/2000 | Ohtani et al. | |
| 6,062,240 A * | 5/2000 | Sada et al. ................ | 134/95.2 |
| 2002/0127340 A1 | 9/2002 | Kitano et al. | |
| 2003/0064609 A1* | 4/2003 | Iseki et al. ................ | 438/782 |
| 2005/0109992 A1* | 5/2005 | Lee et al. .................. | 252/510 |
| 2005/0221234 A1 | 10/2005 | Ito | |

FOREIGN PATENT DOCUMENTS

| | | |
|---|---|---|
| EP | 1 598 704 A2 | 11/2005 |
| EP | 1 732 108 A1 | 12/2006 |
| JP | 59-11628 | 1/1984 |
| JP | 8-222513 | 8/1996 |
| JP | 8-314156 | 11/1996 |
| JP | 10-303114 | 11/1998 |
| JP | 11-74195 | 3/1999 |
| JP | 11-260686 | 9/1999 |
| JP | 2003-76018 | 3/2003 |
| JP | 2003-332213 | 11/2003 |
| JP | 2004-95705 | 3/2004 |
| JP | 2005-353763 | 12/2005 |
| WO | WO 99/49504 | 9/1999 |
| WO | WO 00/55691 | 9/2000 |
| WO | WO 2005/101467 A1 | 10/2005 |

OTHER PUBLICATIONS

Switkes et al.; "Immersion Lithography at 157 nm"; *J. Vac. Sci. Technol. B* 19(6); c. 2001; American Vacuum Society; pp. 2353-2356.
Honda, T. ,et al.,"Arf Immersion Lithography: Critical Optical Issues", Proceedings of SPIE, May 2004, pp. 319-328, vol. 5377, Optical Microlithography, USA.
Mulkens, J., et al., "Immersion Lithography Exposure Systems: Today's Capabilities and Tomorrow's Expectations", Proceeding of SPIE, May 2004, pp. 710-724, vol. 5754, Optical Microlithography, USA.
Asaumi,S., et al., "Mechanism of Photoresist Resolution Improvement by Pre-exposure Treatment", Journal of the Electrochemical Society, Aug. 1990, pp. 2546-2549, vol. 137, The Electrochemical Society, Inc., USA.
European Search Report issued in corresponding European Patent Application No. EP 05 01 2154, dated Feb. 8, 2007.
Japanese Office Action Issued in corresponding Japanese Patent Application No. JP 2004-171592, dated Jan. 23, 2007.

\* cited by examiner

*Primary Examiner*—Kathleen Duda
(74) *Attorney, Agent, or Firm*—McDermott Will & Emery LLP

(57) ABSTRACT

An exposure system includes a cleaning unit for cleaning a surface of a resist film formed on a wafer with a cleaning fluid and an exposure unit for performing pattern exposure with an immersion liquid provided between the resist film and a projection lens.

20 Claims, 9 Drawing Sheets

EXPOSURE SYSTEM AND PATTERN FORMATION METHOD

CROSS-REFERENCE TO RELATED APPLICATIONS

This application claims priority under 35 U.S.C. §119 on patent application Ser. No. 2004-171592 filed in Japan on Jun. 9, 2004, the entire contents of which are hereby incorporated by reference.

BACKGROUND OF THE INVENTION

The present invention relates to an exposure system for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Now, a conventional pattern formation method employing the immersion lithography will be described with reference to FIGS. 9A through 9D.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Next, as shown in FIG. 9A, the aforementioned chemically amplified resist material is applied on a substrate 1 so as to form a resist film 2 with a thickness of 0.35 μm.

Then, as shown in FIG. 9B, with a liquid (water) 3 provided between the resist film 2 and a projection lens 5, pattern exposure is carried out by irradiating the resist film 2 with exposing light 4 of ArF excimer laser with NA of 0.68 through a mask.

After the pattern exposure, as shown in FIG. 9C, the resist film 2 is baked with a hot plate at a temperature of 105° C. for 60 seconds, and the resultant resist film is developed with a tetramethylammonium hydroxide developer in a concentration of 0.26 N. In this manner, a resist pattern 2a made of an unexposed portion of the resist film 2 is formed as shown in FIG. 9D.

SUMMARY OF THE INVENTION

As shown in FIG. 9D, however, the resist pattern 2a formed by the conventional pattern formation method employing the immersion lithography is in a defective shape.

The present inventors have variously examined the reason why the resist pattern formed by the conventional immersion lithography is in a defective shape, resulting in finding that the defective shape of the pattern is caused because particles adhered onto the surface of the resist film 2 float into the immersion liquid 3 so as to scatter the exposing light 4.

Accordingly, the resist pattern is formed in a defective shape when the exposure is performed through the liquid including such particles, and when the resist pattern in such a defective shape is used for etching, a pattern made of an etched film is also in a defective shape. As a result, the productivity and the yield of the fabrication process for semiconductor devices are disadvantageously lowered.

Also in conventional exposure performed in a dry state without using an immersion liquid (hereinafter referred to as the dry exposure), particles adhered onto an applied resist film affect exposing light, and hence, the accuracy (resolution) of the exposure may be degraded.

In consideration of the aforementioned conventional problem, an object of the invention is forming a resist pattern in a good shape through lithography, and more particularly, through the immersion lithography.

In order to achieve the object, according an exposure system, and more particularly, an exposure system used in the immersion lithography and a pattern formation method of the present invention, the surface of a resist film is cleaned or dissolved before exposure, so as to remove particles remaining on the surface of the resist film.

At this point, how it is significant, in the exposure through the immersion lithography (hereinafter referred to as the immersion exposure) rather than in the dry exposure, to remove particles from the surface of a resist film will be described. In the immersion exposure, a liquid such as water is filled between a resist film formed on a wafer and an exposure lens so as to increase the substantial value of the numerical aperture (NA) as described above. Accordingly, if particles remain on the surface of the resist film, the remaining particles start to float into the liquid when the liquid is provided on the resist film. In the dry exposure, abnormal exposure is caused merely in a portion where a particle is adhered onto the resist film. In contrast, in the immersion exposure, the resist film is in direct contact with the immersion liquid during the exposure, and therefore, the particles are easily released from the surface of the resist film so as to float into the liquid, resulting in scattering the exposing light in arbitrary positions. Furthermore, there arises another problem that the floating particles are adhered onto the exposure lens whose accuracy is significant. In other words, it is apprehended in the immersion exposure that one particle degrades exposure accuracy in a plurality of positions. Accordingly, adhesion of particles onto the resist film is a very serious problem as compared with that in the dry exposure.

Therefore, the present inventors have found that whichever the immersion exposure or the dry exposure is employed, a resist pattern can be formed in a good shape through exposure and development by removing particles, before the exposure, by cleaning or dissolving the surface of a resist film formed on a wafer.

The present invention was devised on the basis of the finding and is specifically practiced as follows:

The first exposure system of this invention includes: a coating unit for forming a resist film on a substrate; a cleaning unit for cleaning a surface of the resist film; and an exposure unit for performing pattern exposure with a liquid provided between the resist film and an exposure lens, wherein the cleaning unit is placed between the coating unit and the exposure unit.

In the first exposure system, after cleaning the resist film formed on the wafer before exposure within the exposure system generally kept at high cleanness, the immersion exposure is performed by the exposure unit for performing the pattern exposure with the liquid provided. Therefore, pattern failures derived from particles can be prevented in the immersion exposure.

The second exposure system of this invention includes: a coating unit for forming a resist film on a substrate; a cleaning unit for cleaning a surface of the resist film; and an exposure unit for performing pattern exposure, wherein the cleaning unit is placed between the coating unit and the exposure unit.

In the second exposure system, after cleaning the resist film formed on the wafer before exposure within the exposure system generally kept at high cleanness, the dry exposure is performed by the exposure unit for performing the pattern exposure. Therefore, pattern failures derived from particles can be prevented.

In the first or second exposure system of this invention, it is preferable that the cleaning unit and the exposure unit are placed in a chamber, a plurality of arms each having a wafer holding head are set in the chamber, and one of the plurality of arms is placed in the cleaning unit while another one of the plurality of arms is placed in the exposure unit. Thus, the resist film can be cleaned on the first stage and the wafer having the resist film cleaned can be moved to the second stage for performing the pattern exposure within one exposure system. Therefore, even when the cleaning process is additionally carried out, the throughput of the exposure is not largely degraded.

The first pattern formation method of this invention includes the steps of forming a resist film on a substrate; cleaning a surface of the resist film; performing pattern exposure by selectively irradiating the resist film with exposing light with a liquid provided on the resist film whose surface has been cleaned; and forming a resist pattern by developing the resist film after the pattern exposure.

In the first pattern formation method, since the pattern exposure is performed with the liquid provided on the resist film whose surface has been cleaned, pattern failures derived from particles can be prevented in the immersion exposure.

The second pattern formation method of this invention includes the steps of forming a resist film on a substrate; dissolving a surface of the resist film; performing pattern exposure by selectively irradiating the resist film with exposing light with a liquid provided on the resist film whose surface has been dissolved; and forming a resist pattern by developing the resist film after the pattern exposure.

In the second pattern formation method, since the pattern exposure is performed with the liquid provided on the resist film whose surface has been dissolved for removing particles adhered thereon, pattern failures derived from the particles can be prevented in the immersion exposure.

The third pattern formation method of this invention includes the steps of forming a resist film on a substrate; cleaning a surface of the resist film; performing pattern exposure by selectively irradiating, with exposing light, the resist film whose surface has been cleaned; and forming a resist pattern by developing the resist film after the pattern exposure.

In the third pattern formation method, since the pattern exposure is performed on the resist film whose surface has been cleaned, pattern failures derived from particles can be prevented in the dry exposure.

The fourth pattern formation method of this invention includes the steps of forming a resist film on a substrate; dissolving a surface of the resist film; performing pattern exposure by selectively irradiating, with exposing light, the resist film whose surface has been dissolved; and forming a resist pattern by developing the resist film after the pattern exposure.

In the fourth pattern formation method, since the pattern exposure is performed on the resist film whose surface has been dissolved for removing particles adhered thereon, pattern failures derived from the particles can be prevented in the dry exposure.

It is noted that the cleaning or dissolving step performed on the resist film before the exposure may be carried out inside or outside of the exposure system in any of the first through fourth pattern formation methods.

In the first or third pattern formation method, the surface of the resist film may be cleaned with water or ozone water.

In the second or fourth pattern formation method, the surface of the resist film is dissolved in an alkaline aqueous solution. The thickness of the resist film thus removed is approximately 0.1 nm through 10 nm and preferably several nm.

In this case, the alkaline aqueous solution may be a developer used for developing the resist film or a diluted developer obtained by diluting the developer. Also, the diluted developer used in this case preferably has a concentration not lower than 0.01 N and lower than 0.26 N, which does not limit the invention.

In the first exposure system and the first and second pattern formation methods of the invention, the liquid can be water or perfluoropolyether.

In any of the first and second exposure systems and the first through fourth pattern formation methods of the invention, the exposing light can be KrF excimer laser, ArF excimer laser, $F_2$ laser, $Xe_2$ laser, $Ar_2$ laser or ArKr laser.

BRIEF DESCRIPTION OF THE DRAWINGS

FIG. 3A is a schematic cross-sectional view of a cleaning unit thereof and FIG. 3B is a partial cross-sectional view of a pattern exposure unit thereof;

DETAILED DESCRIPTION OF THE INVENTION

Embodiment 1

Embodiment 1 of the invention will now be described with reference to the accompanying drawings.

Figure 1:
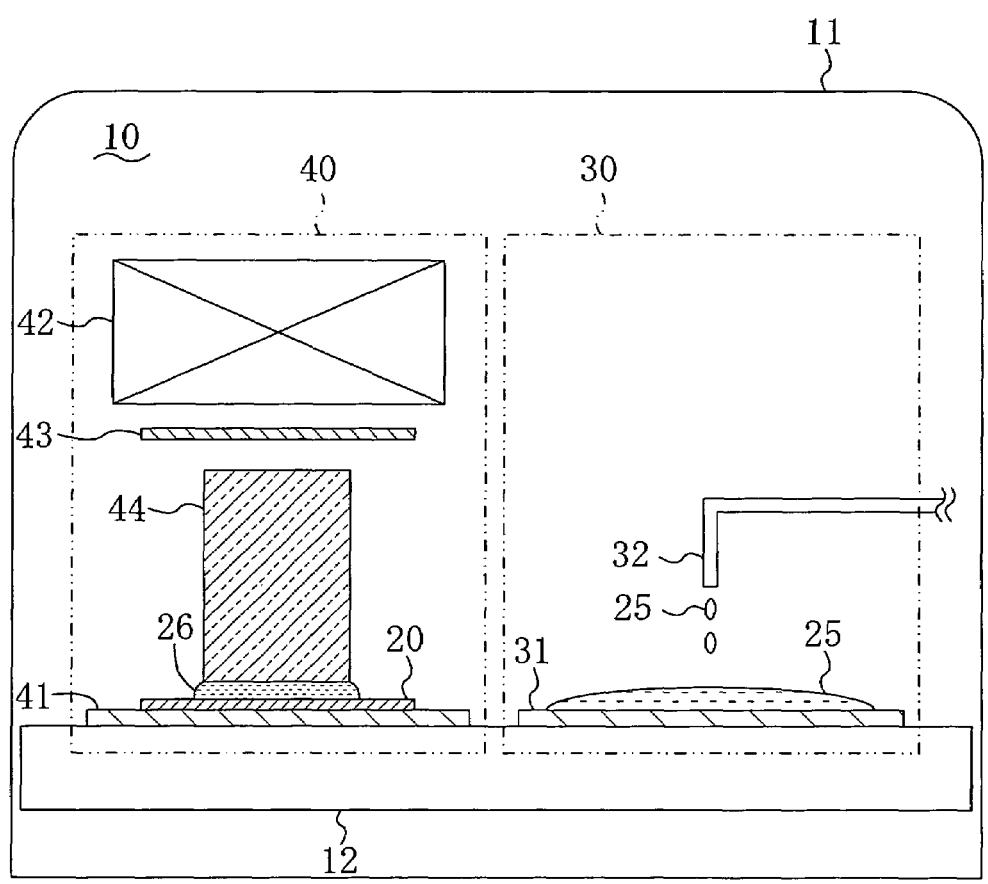
FIG. 1 is a schematic cross-sectional view of a principal part of an exposure system according to Embodiment 1 of the invention.

FIG. 1 schematically shows the cross-sectional structure of a principal part of an exposure system according to Embodiment 1 of the invention. As shown in FIG. 1, the exposure system 10 of Embodiment 1 is provided in a chamber 11. Also, it includes a cleaning unit 30 for cleaning a resist film (not shown) formed on a principal surface of a wafer 20 and a pattern exposure unit 40 for performing pattern exposure on the cleaned resist film.

In a lower portion of the chamber 11, a surface plate 12 for supporting a stage where the wafer 20 is placed is provided. In this case, the stage includes twin stages of, for example, a first movable stage 31 and a second movable stage 41. The first movable stage 31 and the second movable stage 41 are spaced from each other on the surface plate 12 so as to be individually moved by the surface plate 12.

The cleaning unit 30 includes, above the first movable stage 31, a cleaning fluid supplying nozzle 32 for cleaning the surface of the resist film on the wafer 20 with a cleaning fluid 25.

The pattern exposure unit 40 includes an illumination optical system 42 including a light source for the pattern exposure and a projection lens 44 provided below the illumination optical system 42. The projection lens 44 projects, through an immersion liquid 26 onto the resist film, exposing light emitted from the illumination optical system 42 and entering through a mask (reticle) 43 having a design pattern to be transferred onto the resist film. Below the projection lens 44, the second movable stage 41 for holding the wafer 20 is disposed. At this point, the projection lens 44 is held so as to be in contact with the surface of the liquid 26 provided on the resist film on the wafer 20 during the exposure.

Figure 2A:
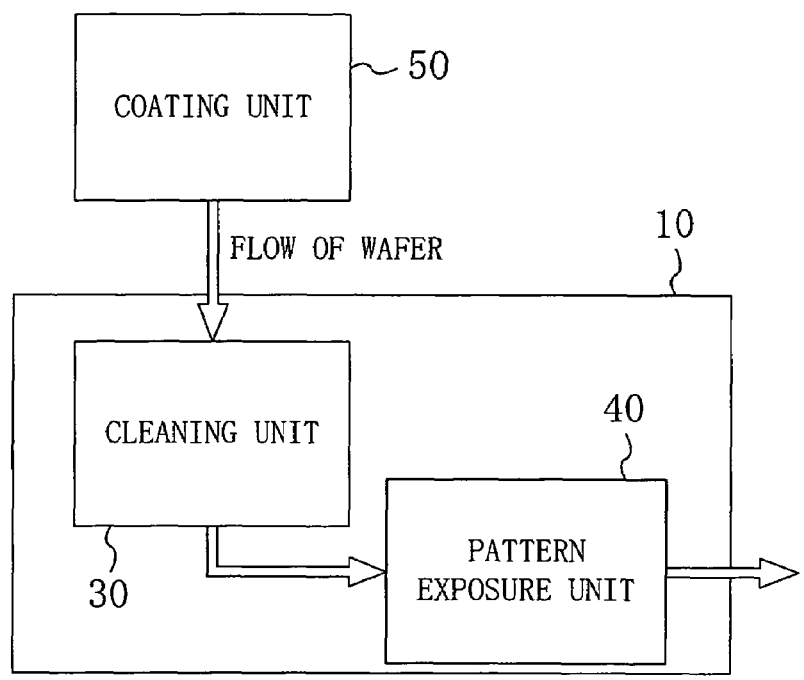
FIGS. 2A and 2B are respectively a block diagram and a schematic plan view of the exposure system of Embodiment 1.

Now, the flow of a wafer in the exposure system 10 will be described with reference to FIG. 2A. FIG. 2A simply shows the units included in the exposure system. As shown in FIG. 2A, first, a resist film is applied on a principal surface of the wafer in a general coating unit 50, and the resultant wafer having the resist film is transferred to the exposure system 10. The wafer having been transferred to the cleaning unit 30 of the exposure system 10 is cleaned on the surface of the resist film in the cleaning unit 30. Subsequently, the wafer having the surface of the resist film cleaned in the cleaning unit 30 of the exposure system 10 is transferred to the pattern exposure unit 40 of the exposure system 10, where the immersion exposure is performed.

Figure 2B:
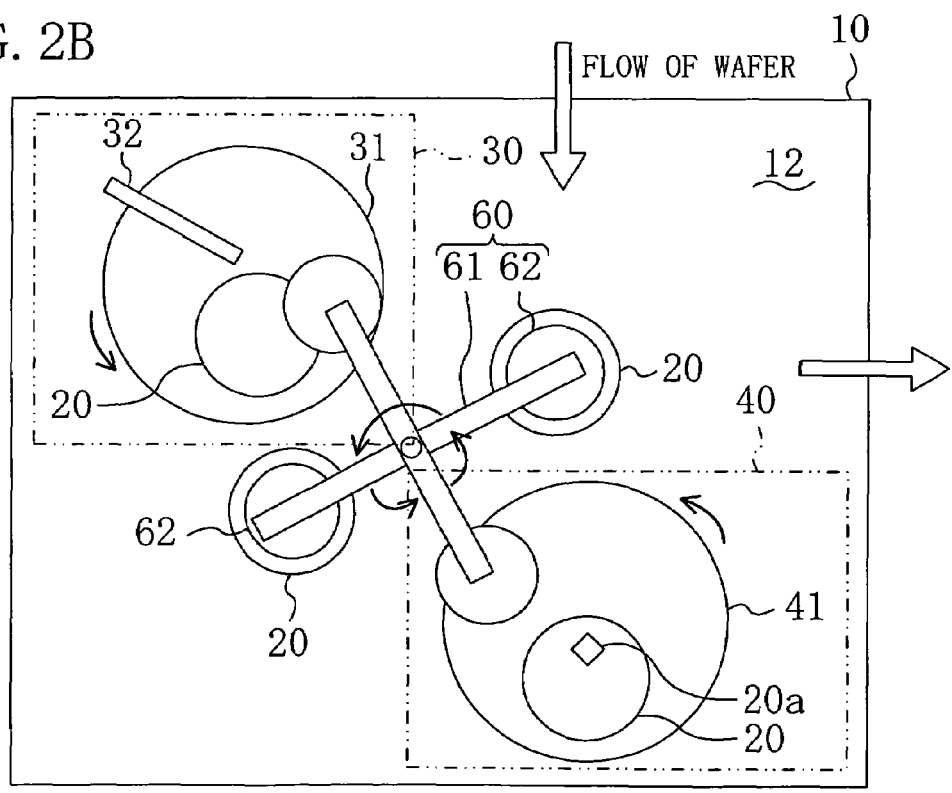

Next, the detailed flow of a wafer within the exposure system 10 will be described with reference to FIG. 2B. In this drawing, the illumination optical system 42, the projection lens 44 and the like of the pattern exposure unit 40 are omitted. As shown in FIG. 2B, a conveyer 60 capable of conveying the wafer 20 between the cleaning unit 30 and the pattern exposure unit 40 is provided between the cleaning unit 30 and the pattern exposure unit 40.

The conveyer 60 includes arm portions 61 and wafer holding heads 62. Specifically, as the arm portions 61, a plurality of arms having their center at the center of the exposure system are radially provided. In other words, the arm portions 61 include two arms parallel to the principal surface of the surface plate 12 and crossing each other on a crossing part. Also, the arm portions 61 are rotatable with the crossing part set as the rotation axis and in parallel to the principal surface of the surface plate 12. The four arm portions 61 composed of the two crossing arms are held so as to have an angle between the adjacent arm portions of approximately 90°. The wafer holding head 62 is provided on each tip of the arm portions 61. The wafer 20 having been transferred after the film deposition is held to be adsorbed on the wafer holding head 62 by using the atmospheric pressure or the like.

The wafer 20 having been transferred from the coating unit 50 on which the resist film has been applied is held on one wafer holding head 62 of the conveyer 60 to be moved to the first movable stage 31. The wafer 20 having been moved to the first movable stage 31 is cleaned for particles adhered onto the resist film with the cleaning fluid 25 supplied from the cleaning fluid supplying nozzle 32. At this point, when the first movable stage 31 is rotated on the plane of the stage, the removal of the particles is accelerated by using the centrifugal force. When the cleaning of the resist film is completed, the cleaned wafer 20 is held on the wafer holding head 62 of the conveyer 60 again, and is moved to the second movable stage 41 of the pattern exposure unit 40. In general, the whole principal surface of the wafer 20 is not exposed at one time but the wafer 20 is divided into a plurality of exposure regions 20a and each of the exposure regions 20a is exposed. Accordingly, in the wafer 20 having been moved to the second movable stage 41 of the pattern exposure unit 40, a desired design pattern is successively exposed on each of the exposure regions 20a, and then, the resultant wafer 20 is transferred to a developing unit (not shown) for subsequent processing.

Next, the operations of the cleaning unit 30 and the pattern exposure unit 40 of the exposure system 10 will be described with reference to FIGS. 3A and 3B.

Figure 3A:
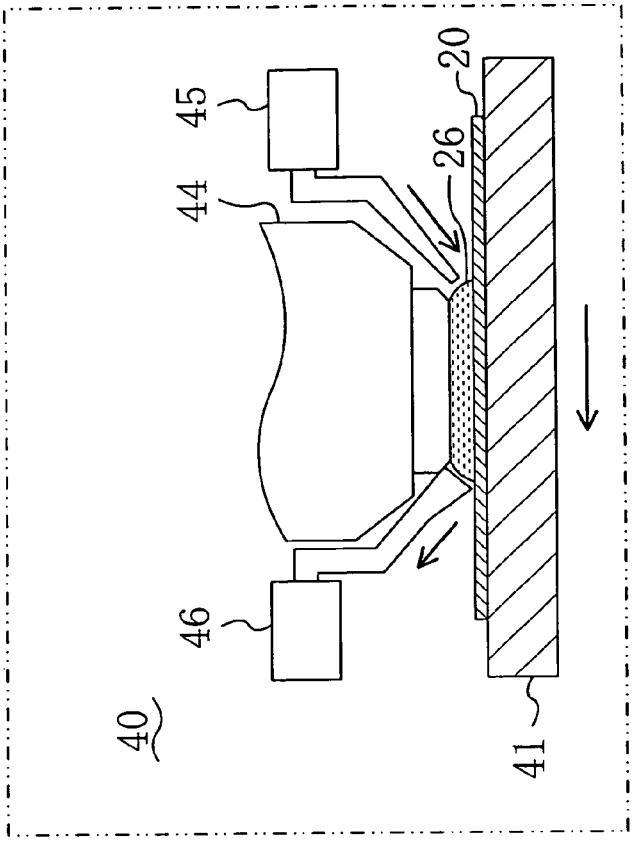
FIGS. 3A and 3B are diagrams of the exposure system of Embodiment 1, and specifically.

First, the wafer 20 having a resist film applied thereon is held on the first movable stage 31 of the cleaning unit 30 as shown in FIG. 3A. Subsequently, with the first movable stage 31 rotated, the cleaning fluid 25 is dropped on the resist film from the cleaning fluid supplying nozzle 32 provided above the first movable stage 31. As the cleaning fluid 25, for example, ozone water obtained by dissolving ozone ($O_3$) in water (pure water) can be used. In this case, apart from the method for dropping the cleaning fluid 25 in the form of drops onto the resist film, a method for supplying the cleaning fluid in a smaller particle size, namely, for spraying the cleaning fluid, may be employed. This is because the surface of the resist film may be harmfully affected by the impact of drops when the cleaning fluid is dropped on the resist film in the form of drops.

Figure 3B:
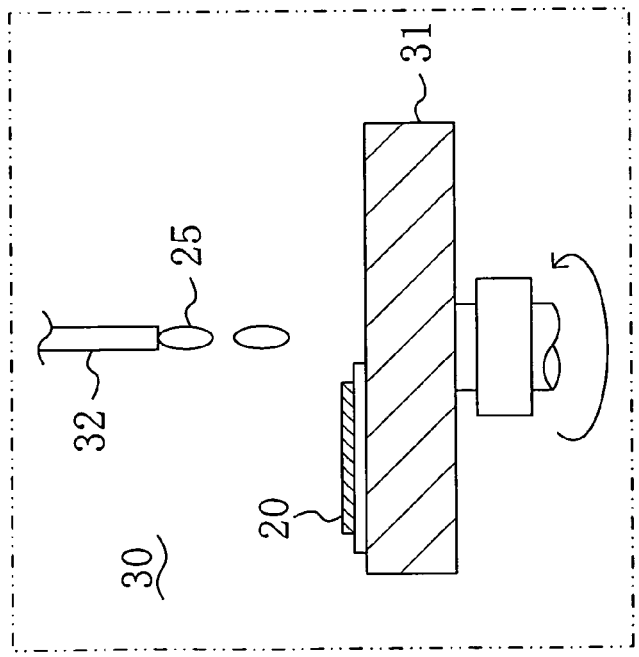

Next, as shown in FIG. 3B, a supply port 45 for supplying the immersion liquid 26 onto the wafer 20 and a discharge port 46 for discharging the supplied liquid 26 from above the wafer 20 are provided on the side of the projection lens 44. After the wafer 20 having the resist film cleaned is moved to the second movable stage 41 of the pattern exposure unit 40, the immersion liquid 26 is supplied from the supply port 45 to a region that corresponds to one exposure region 20a of the wafer 20 and is sandwiched between the resist film and the projection lens 44. Subsequently, the exposure region 20a is subjected to desired pattern exposure with the liquid 26 provided between the resist film and the projection lens 44, and then, the liquid 26 is discharged from the discharge port 46. Next, after the second movable stage 41 is moved by a given distance for the exposure of another exposure region 20a, the liquid 26 is supplied onto this exposure region 20a, which is then subjected to the desired pattern exposure. In this manner, all the exposure regions 20a on the wafer 20 are successively exposed. At this point, in order to improve the throughput in the immersion exposure, the operations for supplying the immersion liquid 26, performing the exposure and discharging the liquid 26 are preferably continuously performed.

In this manner, according to the exposure system 10 of Embodiment 1, the surface of the resist film formed on the wafer 20 is cleaned immediately before the pattern exposure in the cleaning unit 30 provided in the chamber 11 with high cleanness, so as to remove particles adhered onto the resist film. Therefore, the pattern exposure is not affected by the particles, so that the resist film can be formed into a resist pattern in a good shape.

The immersion liquid 26 is supplied onto each of the exposure regions 20a on the wafer 20 by employing what is called the dropping method in Embodiment 1, which does not limit the invention. Instead, the invention is effective when what is called the pooling method in which the wafer 20 itself is immersed in the liquid is employed.

Also, in the exposure system 10 of Embodiment 1, the cleaning unit 30 and the pattern exposure unit 40 are provided in the chamber 11, but the cleaning unit 30 may be provided outside the exposure system 10. Furthermore, if the environment (atmosphere) in which the exposure system 10 is installed has sufficiently high cleanness, the chamber 11 is not always necessary.

(Pattern Formation Method)

Now, a pattern formation method using the exposure system having the aforementioned structure will be described with reference to FIGS. 4A through 4E.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 4A:
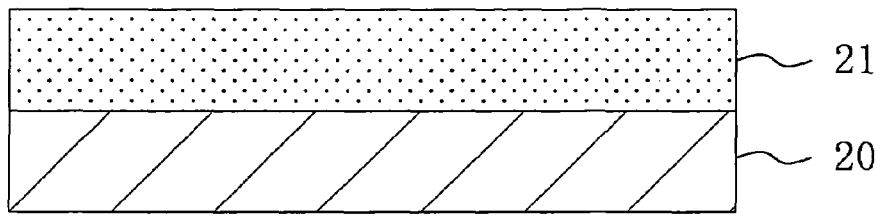
FIGS. 4A, 4B, 4C, 4D and 4E are cross-sectional views for showing procedures in a pattern formation method employing the immersion exposure according to Embodiment 1 of the invention.

Next, as shown in FIG. 4A, the aforementioned chemically amplified resist material is applied on a wafer 20 so as to form a resist film 21 with a thickness of 0.35 μm.

Figure 4B:
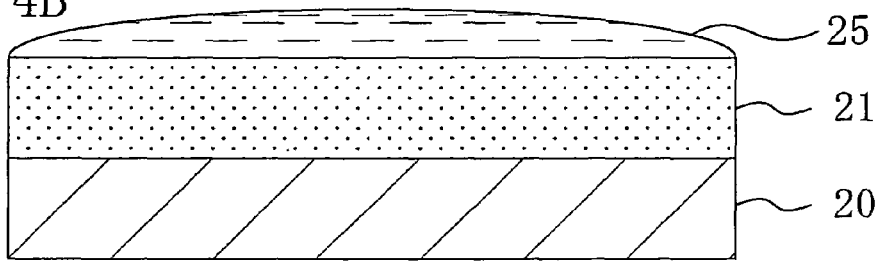

Then, as shown in FIG. 4B, the resist film 21 is cleaned with a cleaning fluid 24 of, for example, water in the cleaning unit 30 of the exposure system 10 of FIG. 1.

Figure 4C:
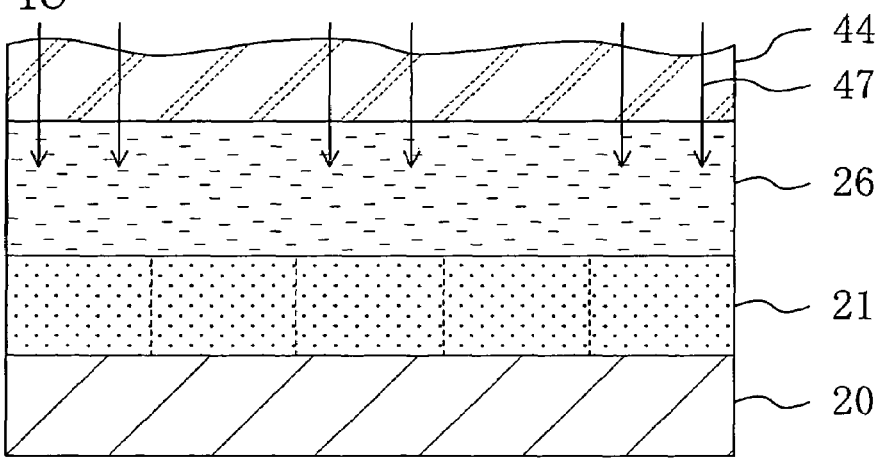

Next, as shown in FIG. 4C, with a liquid 26 of water provided between the resist film 21 and a projection lens 44, pattern exposure is carried out by irradiating the resist film 21 through a mask (not shown) with exposing light 47 of ArF excimer laser with NA of 0.68.

Figure 4D:
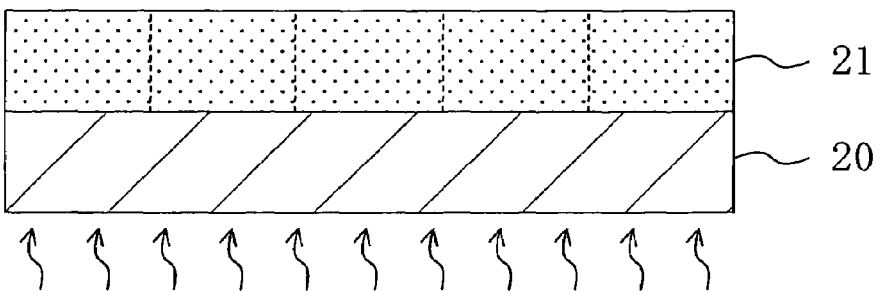
Figure 4E:
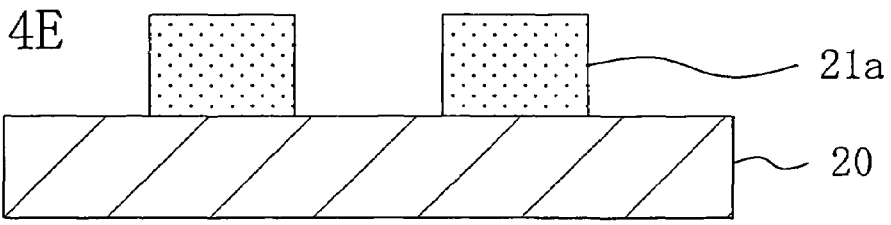

After the pattern exposure, as shown in FIG. 4D, the resist film 21 is baked with a hot plate at a temperature of 105° C. for 60 seconds, and thereafter, the resultant resist film 21 is developed with a tetramethylammonium hydroxide developer in a concentration of 0.26 N. In this manner, a resist pattern 21a made of an unexposed portion of the resist film 21 and having a line width of 0.09 μm is formed in a good shape as shown in FIG. 4E.

In this manner, according to the pattern formation method of Embodiment 1, the surface of the resist film 21 formed on the wafer 20 is cleaned with the cleaning fluid 25 before the pattern exposure so as to remove particles adhered onto the surface of the resist film 21. Accordingly, the pattern exposure is not affected by the particles, so that the resist film 21 can be formed into the resist pattern 21a in a good shape.

Embodiment 2

Now, a pattern formation method employing the immersion exposure according to Embodiment 2 of the invention will be described with reference to FIGS. 5A through 5E.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 5A:
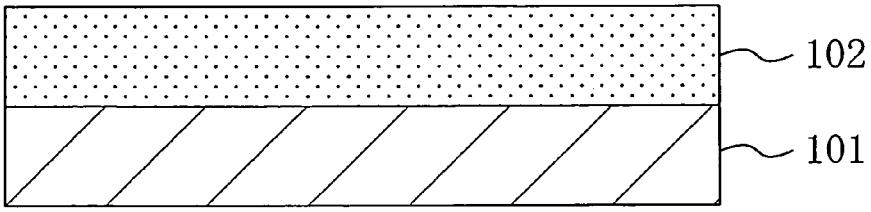
FIGS. 5A, 5B, 5C, 5D and 5E are cross-sectional views for showing procedures in a pattern formation method employing the immersion exposure according to Embodiment 2 of the invention.

Next, as shown in FIG. 5A, the aforementioned chemically amplified resist material is applied on a wafer 101 so as to form a resist film 102 with a thickness of 0.35 μm.

Figure 5B:
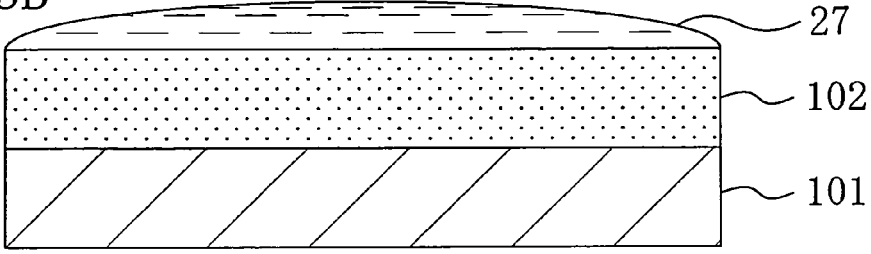

Then, as shown in FIG. 5B, the surface of the resist film 102 is dissolved in an alkaline aqueous solution 27 of, for example, a tetramethylammonium hydroxide developer in a concentration of 0.1 N. Thus, a surface portion of the resist film 102 is removed by the alkaline aqueous solution 27. The thickness of the surface portion of the resist film 102 removed at this point depends upon the concentration of the alkaline aqueous solution and the time for allowing the resist film to be in contact with the alkaline aqueous solution, and is approximately 0.1 nm through 10 nm.

Figure 5C:
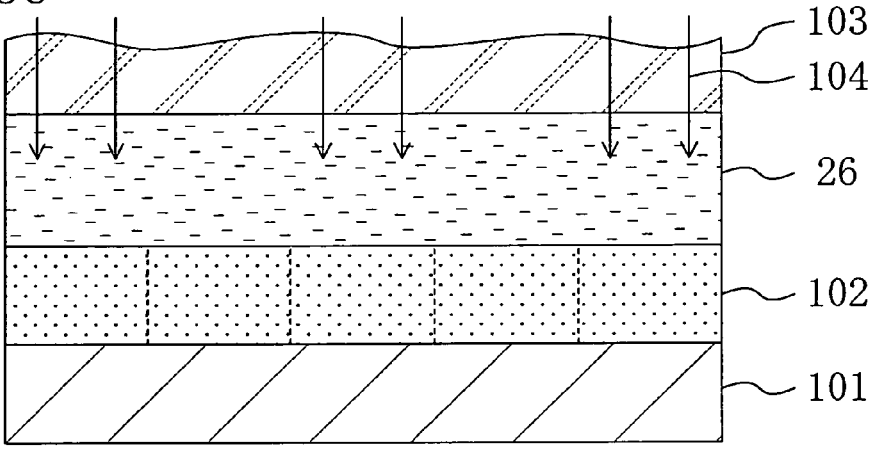

Next, as shown in FIG. 5C, with a liquid 26 of water provided between the resist film 102 and a projection lens 103, pattern exposure is carried out by irradiating the resist film 102 through a mask (not shown) with exposing light 104 of ArF excimer laser with NA of 0.68.

Figure 5D:
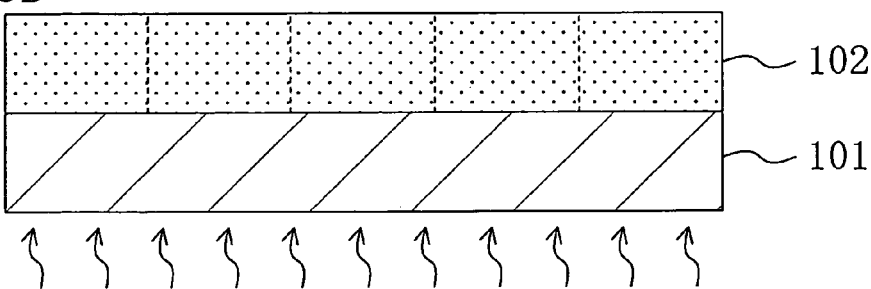
Figure 5E:
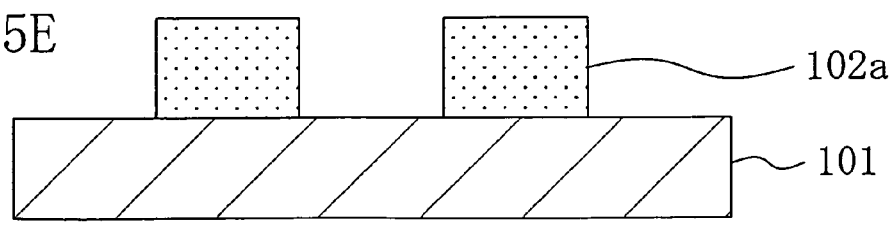

After the pattern exposure, as shown in FIG. 5D, the resist film 102 is baked with a hot plate at a temperature of 105° C. for 60 seconds, and thereafter, the resultant resist film 102 is developed with a tetramethylammonium hydroxide developer in a concentration of 0.26 N. In this manner, a resist pattern 102a made of an unexposed portion of the resist film 102 and having a line width of 0.09 μm is formed in a good shape as shown in FIG. 5E.

In this manner, according to the pattern formation method of Embodiment 2, the surface of the resist film 102 formed on the wafer 101 is dissolved in the alkaline aqueous solution 27 obtained by diluting a general alkaline developer, so as to remove particles adhered onto the surface of the resist film. Accordingly, the pattern exposure is not affected by the particles, so that the resist film 102 can be formed into the resist pattern 102a in a good shape.

Embodiment 3

Embodiment 3 of the invention will now be described with reference to the accompanying drawings.

Figure 6:
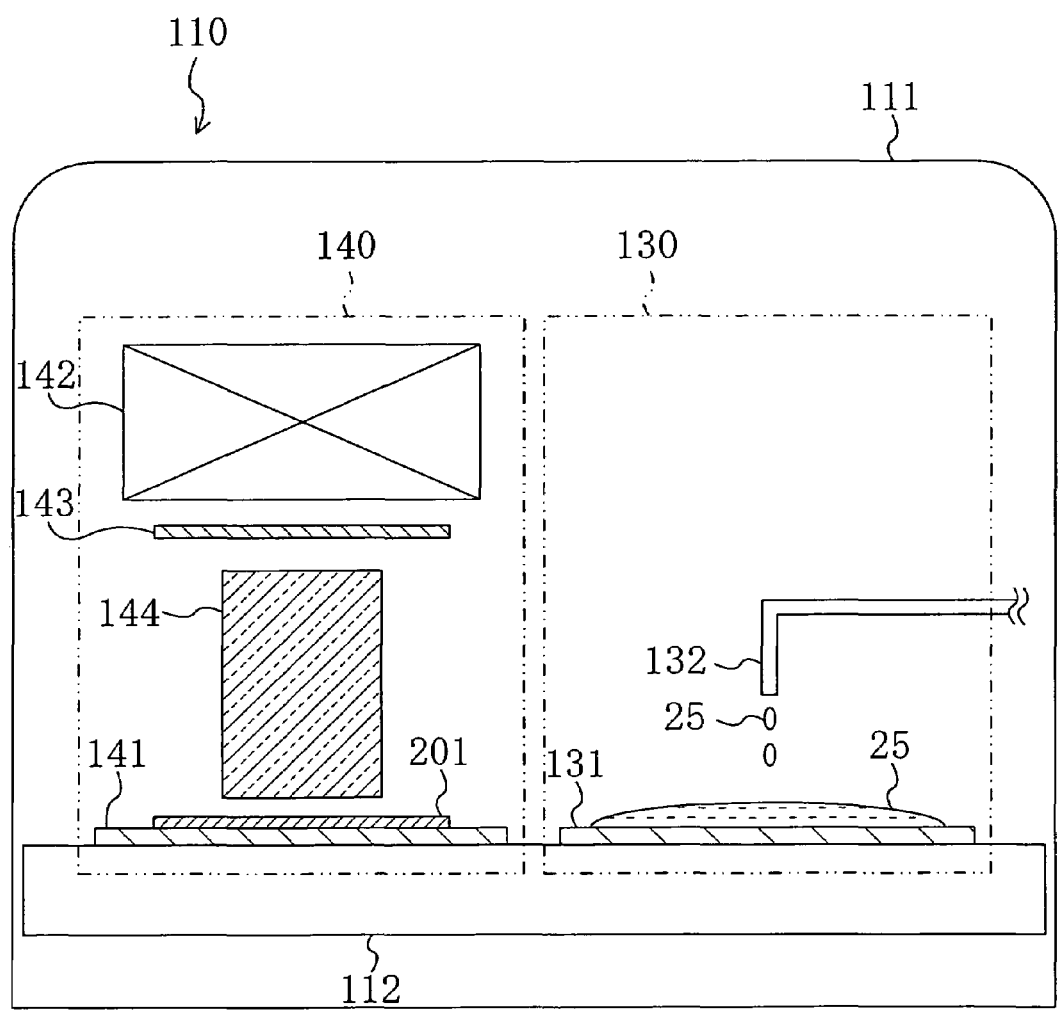
FIG. 6 is a schematic cross-sectional view of a principal part of an exposure system according to Embodiment 3 of the invention.

FIG. 6 schematically shows the cross-sectional structure of a principal part of an exposure system according to Embodiment 3 of the invention. As shown in FIG. 6, the exposure system 110 of Embodiment 3 is provided in a chamber 111 and includes a cleaning unit 130 for cleaning a resist film (not shown) formed on a principal surface of a wafer 201 and a pattern exposure unit 140 for performing pattern exposure on the cleaned resist film.

In a lower portion of the chamber 111, a surface plate 112 is provided for supporting what is called twin stages of a first movable stage 131 and a second movable stage 141 that are spaced from each other and individually movable.

The cleaning unit 130 includes, above the first movable stage 131, a cleaning fluid supplying nozzle 132 for cleaning the surface of the resist film formed on the wafer 201 with a cleaning fluid 25.

The pattern exposure unit 140 includes an illumination optical system 142 including a light source for the pattern exposure and a projection lens 144 provided below the illumination optical system 142 for projecting, onto the resist film, exposing light emitted from the illumination optical system 142 and entering through a mask (reticle) 143 having a design pattern to be transferred onto the resist film. Below the projection lens 144, the second movable stage 141 for holding the wafer 201 is disposed.

It is noted that the plane structure of the cleaning unit 130 and the pattern exposure unit 140 of the exposure system 110 of Embodiment 3 is equivalent to that of the exposure system 10 of Embodiment 1 shown in FIG. 2B.

Also, although the cleaning unit 130 and the pattern exposure unit 140 are provided in the chamber 111 in Embodiment 3, the cleaning unit 130 may be provided outside the exposure system 110. Furthermore, if the environment (atmosphere) in which the exposure system 110 is installed has sufficiently high cleanness, the chamber 111 is not always necessary.

(Pattern Formation Method)

Now, a pattern formation method using the exposure system for the dry exposure having the aforementioned structure will be described with reference to FIGS. 7A through 7E.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 7A:
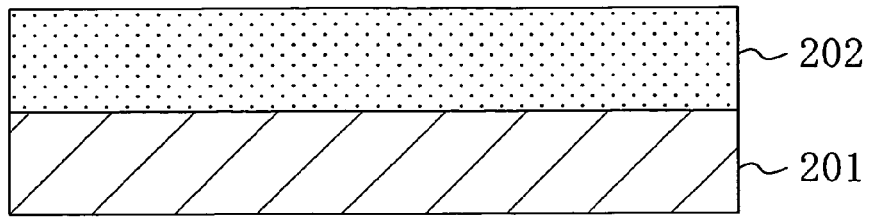
FIGS. 7A, 7B, 7C, 7D and 7E are cross-sectional views for showing procedures in a pattern formation method employing the dry exposure according to Embodiment 3 of the invention.

Next, as shown in FIG. 7A, the aforementioned chemically amplified resist material is applied on a wafer 201 so as to form a resist film 202 with a thickness of 0.35 μm.

Figure 7B:
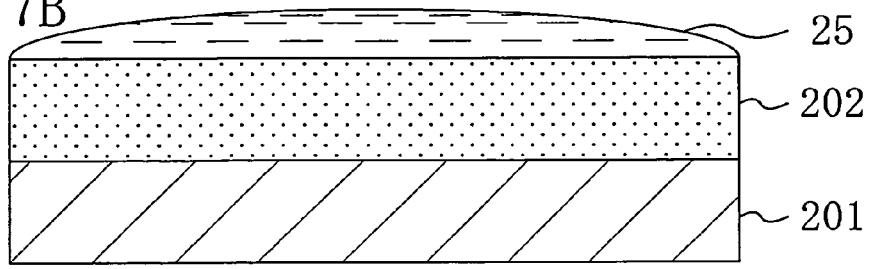

Then, as shown in FIG. 7B, the resist film 202 is cleaned with a cleaning fluid 25 of, for example, water.

Figure 7C:
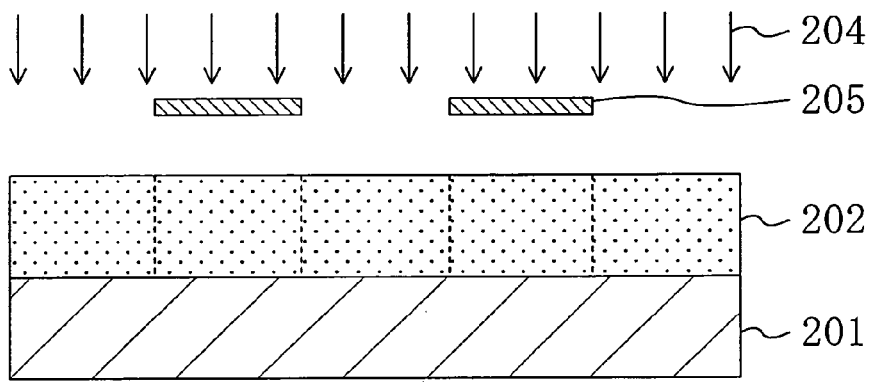

Next, as shown in FIG. 7C, pattern exposure is carried out by irradiating the resist film 202 through a mask 205 with exposing light 204 of ArF excimer laser with NA of 0.68.

Figure 7D:
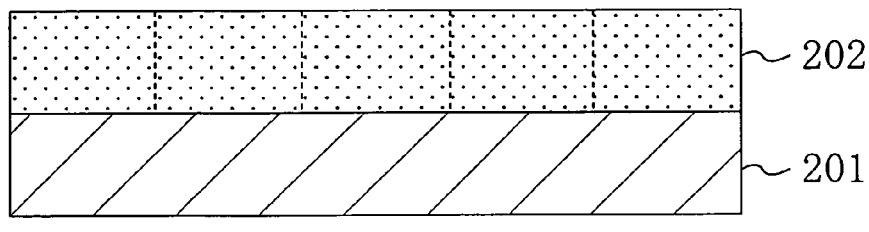
Figure 7E:
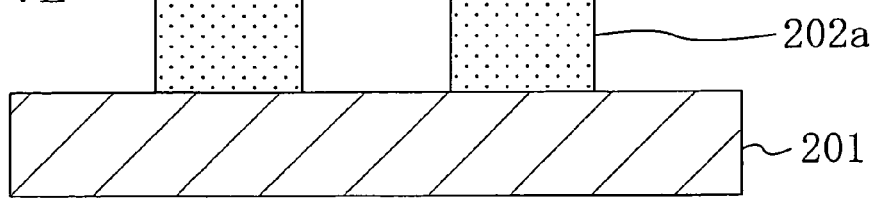

After the pattern exposure, as shown in FIG. 7D, the resist film 202 is baked with a hot plate at a temperature of 105° C. for 60 seconds, and thereafter, the resultant resist film 202 is developed with a tetramethylammonium hydroxide developer in a concentration of 0.26 N. In this manner, a resist pattern 202a made of an unexposed portion of the resist film 202 and having a line width of 0.09 μm is formed in a good shape as shown in FIG. 7E.

In this manner, according to the pattern formation method employing the dry exposure of Embodiment 3, the surface of the resist film 202 formed on the wafer 201 is cleaned with the cleaning fluid 26 before the pattern exposure so as to remove particles adhered onto the surface of the resist film 202. Accordingly, the pattern exposure is not affected by the particles, so that the resist film 202 can be formed into the resist pattern 202a in a good shape.

Embodiment 4

Now, a pattern formation method employing the dry exposure according to Embodiment 4 of the invention will be described with reference to FIGS. 8A through 8E.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 8A:
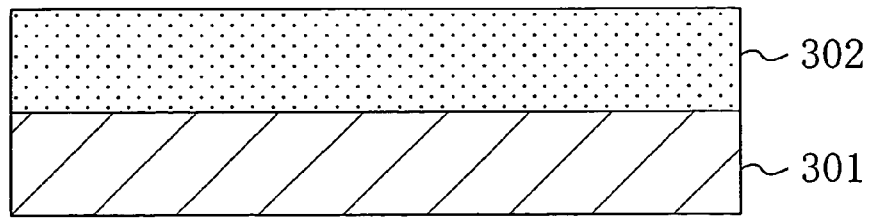
FIGS. 8A, 8B, 8C, 8D and 8E are cross-sectional views for showing procedures in a pattern formation method employing the dry exposure according to Embodiment 4 of the invention.

Next, as shown in FIG. 8A, the aforementioned chemically amplified resist material is applied on a wafer 301 so as to form a resist film 302 with a thickness of 0.35 μm.

Figure 8B:
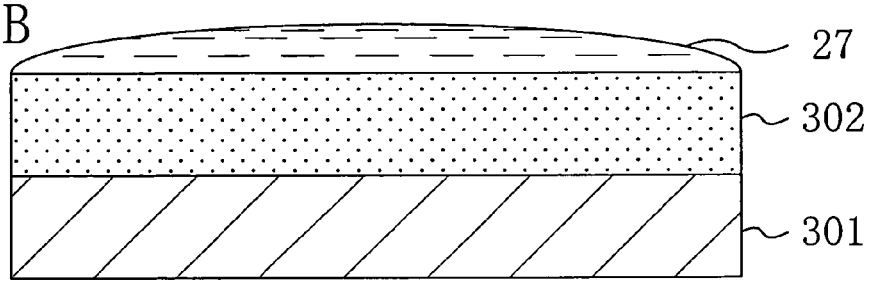

Then, as shown in FIG. 8B, the surface of the resist film 302 is dissolved in an alkaline aqueous solution 27 of, for example, a tetramethylammonium hydroxide developer in a concentration of 0.1 N.

Figure 8C:
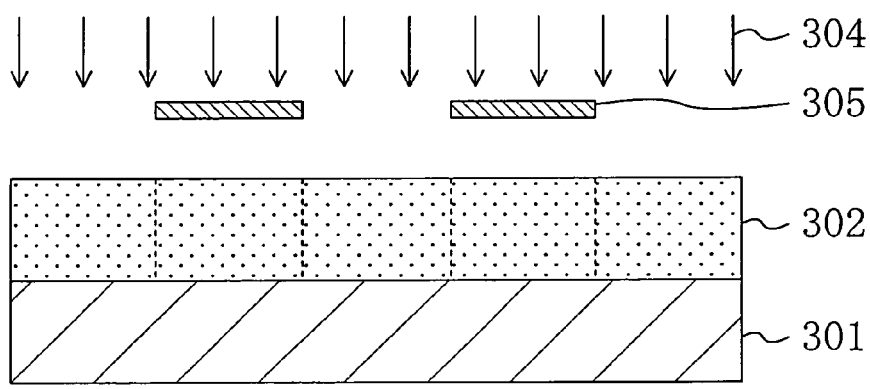

Next, as shown in FIG. 8C, pattern exposure is carried out by irradiating the resist film 302 through a mask 305 with exposing light 304 of ArF excimer laser with NA of 0.68.

Figure 8D:
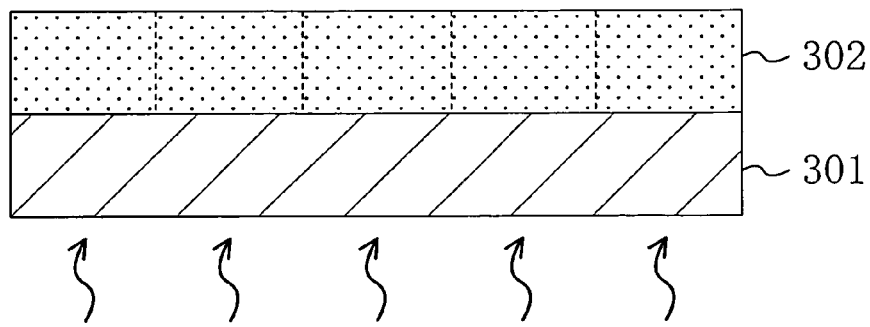
Figure 8E:
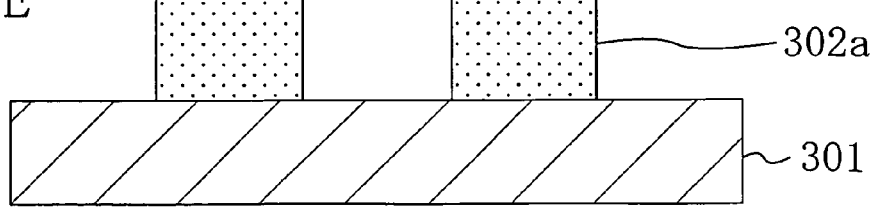
Figure 9A:
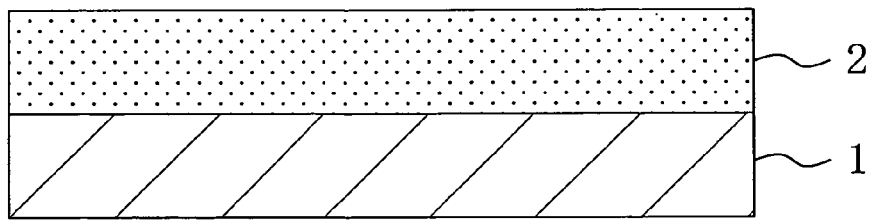
FIGS. 9A, 9B, 9C and 9D are cross-sectional views for showing procedures in a conventional pattern formation method employing the immersion exposure.
Figure 9B:
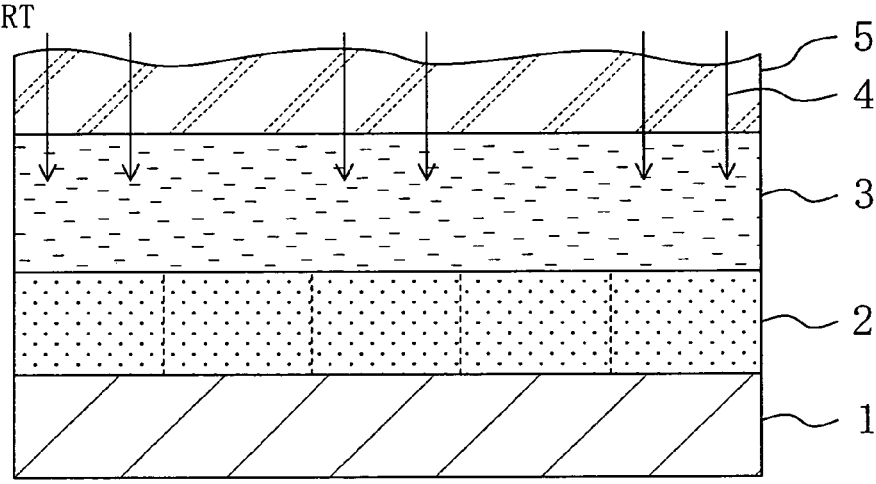
Figure 9C:
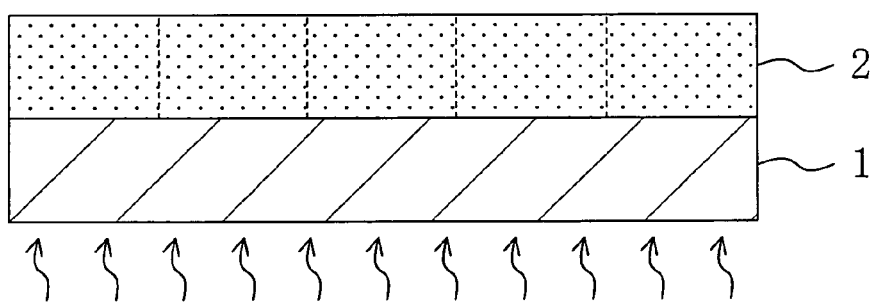
Figure 9D:
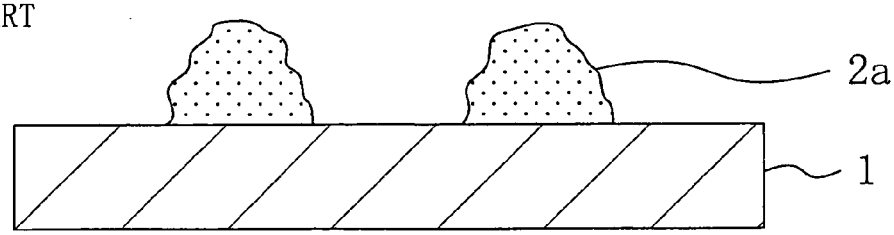

After the pattern exposure, as shown in FIG. 8D, the resist film 302 is baked with a hot plate at a temperature of 105° C. for 60 seconds, and thereafter, the resultant resist film 302 is developed with a tetramethylammonium hydroxide developer in a concentration of 0.26 N. In this manner, a resist pattern 302a made of an unexposed portion of the resist film 302 and having a line width of 0.09 μm is formed in a good shape as shown in FIG. 8E.

In this manner, according to the pattern formation method employing the dry exposure of Embodiment 4, the surface of the resist film 302 formed on the wafer 301 is dissolved in the alkaline aqueous solution 27 obtained by diluting a general alkaline developer, so as to remove particles adhered onto the surface of the resist film 302. Accordingly, the pattern exposure is not affected by the particles, so that the resist film 302 can be formed into the resist pattern 302a in a good shape.

Although the immersion liquid 26 used in Embodiments 1 and 2 is water, it may be perfluoropolyether instead.

Moreover, although ArF excimer laser is used as the exposing light for the pattern exposure, KrF excimer laser, $F_2$ laser, $Xe_2$ laser, $Ar_2$ laser or ArKr laser may be used instead.

Furthermore, the resist film to be subjected to the pattern exposure is not limited to a positive resist film but may be a negative resist film, and needless to say, it is not limited to a chemically amplified resist.

As described so far, in the exposure system and the pattern formation method of this invention, particles adhered onto a resist film are removed before exposure. Therefore, the invention attains an effect to prevent pattern failures derived from the particles and an effect to obtain a resist pattern in a good shape. Thus, the invention is useful as a pattern formation method or the like for forming a fine pattern used in fabrication process or the like for semiconductor devices.

What is claimed is:

1. A pattern formation method comprising the steps of:
   forming a resist film on a substrate;
   cleaning a surface of said resist film;

after the step of cleaning said resist film, performing pattern exposure by selectively irradiating said resist film with exposing light with a liquid provided on said resist film whose surface has been cleaned; and forming a resist pattern by developing said resist film after the pattern exposure, wherein in the step of cleaning the surface of said resist film, said resist film is cleaned by a cleaning fluid supplied from above onto the surface of said resist film.

2. The pattern formation method of claim 1, wherein the cleaning fluid is water or ozone water.

3. The pattern formation method of claim 1, wherein said liquid is water or perfluoropolyether.

4. The pattern formation method of claim 1, wherein said exposing light is KrF excimer laser, ArF excimer laser, $F_2$ laser, $Xe_2$ laser, $Ar_2$ laser or ArKr laser.

5. The pattern formation method of claim 1, wherein in the step of cleaning the surface of said resist film, the cleaning fluid is supplied from a nozzle.

6. The pattern formation method of claim 5, wherein the cleaning fluid is dropped from the nozzle.

7. The pattern formation method of claim 1,
wherein the step of performing pattern exposure includes the steps of;
supplying the liquid between the substrate and a projection lens;
discharging the liquid between the substrate and the projection lens; and
moving the substrate during the exposure,
wherein the step of supplying the liquid, the step of discharging the liquid and the step of moving the substrate are simultaneously performed.

8. The pattern formation method of claim 7, wherein the step of supplying the liquid, the step of discharging the liquid and the step of moving the substrate are successively performed.

9. The pattern formation method of claim 1,
wherein the step of cleaning the surface of said resist film includes the steps of:
supplying the cleaning fluid; and
rotating the substrate.

10. The pattern formation method of claim 9, wherein the step of supplying the cleaning fluid and the step of rotating the substrate are simultaneously performed.

11. The pattern formation method of claim 1, wherein said resist film is a chemically amplified resist film.

12. A pattern formation method comprising the steps of:
forming a resist film on a substrate;
cleaning a surface of said resist film;
after the step of cleaning said resist film, performing pattern exposure by selectively irradiating, with exposing light, said resist film whose surface has been cleaned; and
forming a resist pattern by developing said resist film after the pattern exposure,
wherein in the step of cleaning the surface of said resist film, said resist film is cleaned by a cleaning fluid supplied from above onto the surface of said resist film.

13. The pattern formation method of claim 12, wherein the cleaning fluid is water or ozone water.

14. The pattern formation method of claim 12, wherein said exposing light is KrF excimer laser, ArF excimer laser, $F_2$ laser, $Xe_2$ laser, $Ar_2$ laser or ArKr laser.

15. The pattern formation method of claim 12, wherein in the step of cleaning the surface of said resist film, the cleaning fluid is supplied from a nozzle.

16. The pattern formation method of claim 15, wherein the cleaning fluid is dropped from the nozzle.

17. The pattern formation method of claim 12,
wherein the step of cleaning the surface of said resist film includes the steps of:
supplying the cleaning fluid; and
rotating the substrate.

18. The pattern formation method of claim 17, wherein the step of supplying the cleaning fluid and the step of rotating the substrate are simultaneously performed.

19. The pattern formation method of claim 12, wherein said resist film is a chemically amplified resist film.

20. A pattern formation method comprising the steps of:
forming a resist film on a substrate;
cleaning said substrate on which said resist film has been formed;
after the step of cleaning said resist film, performing pattern exposure by selectively irradiating said resist film with exposing light with a liquid provided on said substrate which has been cleaned; and
forming a resist pattern by developing said resist film after the pattern exposure,
wherein in the step of cleaning said substrate, said substrate is cleaned by a cleaning fluid supplied from above onto the surface of said substrate on which said resist film has been formed.

* * * * *